US009484423B2

United States Patent
Obradovic et al.

(10) Patent No.: US 9,484,423 B2
(45) Date of Patent: Nov. 1, 2016

(54) CRYSTALLINE MULTIPLE-NANOSHEET III-V CHANNEL FETS

(71) Applicant: Samsung Electronics Co., Ltd., Suwon-si, Gyeonggi-do (KR)

(72) Inventors: Borna J. Obradovic, Leander, TX (US); Jorge A. Kittl, Round Rock, TX (US); Mark. S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/270,690

(22) Filed: May 6, 2014

(65) Prior Publication Data

US 2015/0123215 A1    May 7, 2015

Related U.S. Application Data (60) Provisional application No. 61/898,815, filed on Nov. 1, 2013.

(51) Int. Cl.
*H01L 29/78* (2006.01)
*H01L 29/49* (2006.01)
*H01L 29/423* (2006.01)
*H01L 29/786* (2006.01)

(52) U.S. Cl.
CPC ... *H01L 29/42392* (2013.01); *H01L 29/78681* (2013.01); *H01L 29/78696* (2013.01)

(58) Field of Classification Search
CPC   H01L 29/785; H01L 29/786; H01L 29/7586
USPC .......................... 257/410, 194, 330, 288, 213
See application file for complete search history.

(56) References Cited

U.S. PATENT DOCUMENTS

| 5,430,310 | A  | 7/1995  | Shibasaki et al.  |
| 5,461,250 | A  | 10/1995 | Burghartz et al.  |
| 6,603,156 | B2 | 8/2003  | Rim               |
| 7,029,964 | B2 | 4/2006  | Cheng et al.      |
| 7,112,832 | B2 | 9/2006  | Orlowski et al.   |
| 7,262,465 | B2 | 8/2007  | Hatada et al.     |
| 7,276,723 | B2 | 10/2007 | Fathimulla et al. |
| 7,402,483 | B2 | 7/2008  | Yun et al.        |

(Continued)

FOREIGN PATENT DOCUMENTS

| CN | 102194884 A | 9/2011 |
| EP | 1 188 188 B1 | 8/2005 |

(Continued)

OTHER PUBLICATIONS

Cai et al, "III-Nitride metal-insulator-semiconductor heterojunction field-effect transistors using sputtered AION thin film", Applied Physics Letters vol. 86, p. 032109 (2005).*

(Continued)

*Primary Examiner* — Cuong Q Nguyen
*Assistant Examiner* — Tong-Ho Kim
(74) *Attorney, Agent, or Firm* — Myers Bigel & Sibley, P.A.

(57) ABSTRACT

A field effect transistor includes a body layer comprising a crystalline semiconductor channel region therein, and a gate stack on the channel region. The gate stack includes a crystalline semiconductor gate layer, and a crystalline semiconductor gate dielectric layer between the gate layer and the channel region. Related devices and fabrication methods are also discussed.

17 Claims, 8 Drawing Sheets

(56) References Cited

U.S. PATENT DOCUMENTS

| | | |
|---|---|---|
| 7,416,957 B2 | 8/2008 | Ponomarev |
| 7,427,788 B2 | 9/2008 | Li et al. |
| 7,476,930 B2 | 1/2009 | Allibert et al. |
| 7,795,687 B2 | 9/2010 | Suk et al. |
| 7,973,336 B2 | 7/2011 | Savage et al. |
| 8,183,627 B2 | 5/2012 | Currie |
| 8,183,667 B2 | 5/2012 | Park |
| 8,236,626 B2 | 8/2012 | Dai et al. |
| 8,247,806 B2 | 8/2012 | Chae et al. |
| 8,293,608 B2 | 10/2012 | Orlowski et al. |
| 8,309,986 B2 | 11/2012 | Lochtefeld |
| 8,329,541 B2 | 12/2012 | Ye et al. |
| 8,362,604 B2 | 1/2013 | Ionescu |
| 8,384,122 B1 | 2/2013 | Hu et al. |
| 8,404,545 B2 | 3/2013 | Vandenberghe et al. |
| 8,421,165 B2 | 4/2013 | Loh et al. |
| 8,436,422 B2 | 5/2013 | Loh et al. |
| 8,440,517 B2 | 5/2013 | Lin et al. |
| 8,530,884 B2 | 9/2013 | Datta et al. |
| 8,686,402 B2 | 4/2014 | Goel et al. |
| 8,754,470 B1 | 6/2014 | Chuang et al. |
| 8,766,353 B2 | 7/2014 | Doris et al. |
| 8,768,271 B1 | 7/2014 | Then et al. |
| 8,809,987 B2 | 8/2014 | Chen et al. |
| 8,816,326 B2 | 8/2014 | Yin et al. |
| 8,937,299 B2 * | 1/2015 | Basu et al. .................. 257/24 |
| 2001/0013621 A1 | 8/2001 | Nakazato |
| 2002/0109135 A1 | 8/2002 | Murota et al. |
| 2008/0135949 A1 | 6/2008 | Lo et al. |
| 2008/0224183 A1* | 9/2008 | Nawaz .......................... 257/279 |
| 2009/0008630 A1 | 1/2009 | Hurkx et al. |
| 2009/0212324 A1* | 8/2009 | Tamai et al. .................. 257/192 |
| 2010/0038679 A1 | 2/2010 | Chan et al. |
| 2012/0153352 A1 | 6/2012 | Dewey et al. |
| 2012/0193679 A1 | 8/2012 | Chen et al. |
| 2012/0223390 A1 | 9/2012 | Liang et al. |
| 2012/0292665 A1* | 11/2012 | Marino et al. ................. 257/194 |
| 2013/0093497 A1 | 4/2013 | Lee et al. |
| 2013/0119395 A1* | 5/2013 | Bhuwalka et al. ............. 257/76 |
| 2013/0181263 A1 | 7/2013 | Cai |
| 2013/0200433 A1 | 8/2013 | Adam et al. |
| 2014/0034962 A1 | 2/2014 | Curatola et al. |
| 2014/0138744 A1 | 5/2014 | Kotlyar et al. |
| 2014/0197459 A1 | 7/2014 | Kis et al. |
| 2014/0203350 A1 | 7/2014 | Chuang et al. |
| 2014/0273418 A1 | 9/2014 | Cheng |
| 2014/0346573 A1 | 11/2014 | Adam |
| 2015/0179788 A1 | 6/2015 | Teramoto |

FOREIGN PATENT DOCUMENTS

| | | |
|---|---|---|
| WO | WO 2013/095346 | 6/2013 |
| WO | WO 2013/095651 | 6/2013 |
| WO | WO 2013/101001 A1 | 7/2013 |
| WO | WO 2013/101172 A1 | 7/2013 |
| WO | WO 2014/064737 | 5/2014 |

OTHER PUBLICATIONS

Gil, Bernard, "*III-Nitride Semiconductors and Their Modern Devices*," Oxford University Press, 2013, p. 384.

Ionescu A.M. et al. "Tunnel field-effect transistors as energy-efficient electronic switches", *Nature*, vol. 479, No. 7373, pp. 329-337, Nov. 16, 2011.

Lu Y. et al. "Performance of AlGaSb/InAs TFETs With Gate Electric Field and Tunneling Direction Aligned", *Electron Device Letters*, vol. 33, No. 5, pp. 655-657, May 2012.

Moselund K.E. et al. "InAs—Si Nanowire Heterojunction Tunnel FETs", *Electron Device Letters*, vol. 33, No. 10, pp. 1453-1455, Oct. 2012.

Register L.F. et al. "Stepped Broken-Gap Heterobarrier Tunneling Field-Effect Transistor for Ultralow Power and High Speed", *Electron Device Letters*, vol. 32, No. 6, pp. 743-745, Jun. 2011.

* cited by examiner

CRYSTALLINE MULTIPLE-NANOSHEET III-V CHANNEL FETS

CLAIM OF PRIORITY

This application claims priority from U.S. Provisional Patent Application No. 61/898,815 entitled "Fully-Crystalline Multiple-Nanosheet III-V Channel MOSFET" filed on Nov. 1, 2013, the disclosure of which is incorporated by reference herein in its entirety.

BACKGROUND

The present inventive concepts relate to semiconductor devices, and more particularly, to semiconductor field effect transistor devices.

III-V semiconductor-based MOSFETs including III-V channel materials may have good CV/I characteristics and relatively high current at low voltages. This may be attributable to the relatively high mobility achievable in the channel, as well as the relatively low parasitic resistance for some semiconductor/metal combinations. The high mobility may be attributed at least in part to the relatively low electron effective mass. Due to the isotropic nature of the effective mass in many III-V semiconductors, the quantum-confinement mass may also be small, which may result in electron wavefunctions that may be broad and may penetrate into the gate dielectric layer(s) surrounding the channel. The gate dielectric layer(s) may be non-crystalline layers on the channel and/or may separate the channel from a non-crystalline gate electrode. The presence of such non-crystalline layers on the surface of the typically crystalline channel may result in carrier scattering (typically referred to as surface roughness (SR) scattering), which may limit the mobility of confined electrons.

Some III-V semiconductor-based MOSFETs including III-V channel materials may include crystalline buffer layers, such as indium phosphide (InP), around the channel. The crystalline buffer layer(s) may have a thickness that is sufficient to separate the crystalline channel from the non-crystalline layers and help reduce carrier scattering. However, such buffer layers may degrade the short-channel performance of the device, due to the increased separation of the gate electrode and the channel inversion layer. Thus, the use of crystalline buffer layers may limit the use of III-V MOSFETs to relatively long gate lengths (for example, greater than about 40 nm).

SUMMARY

According to some embodiments of the inventive concepts, a field effect transistor includes a body layer comprising a crystalline semiconductor channel region therein, and a gate stack on the channel region. The gate stack includes a crystalline semiconductor gate layer, and a crystalline semiconductor gate dielectric layer between the gate layer and the channel region.

In some embodiments, the gate dielectric layer may be a high-k crystalline semiconductor layer directly on the channel region.

In some embodiments, the channel region, the gate dielectric layer, and/or the gate layer may be respective heteroepitaxial semiconductor layers.

In some embodiments, respective crystal structures of the gate layer, the gate dielectric layer, and/or the channel region may be lattice-matched. For example, respective crystal structures of the gate dielectric layer and the channel region may be lattice-matched. Also, respective crystal structures of the gate layer and the gate dielectric layer may be lattice-matched.

In some embodiments, the channel region and the gate dielectric layer may be lattice-mismatched to create a strain therein of less than about 1% therein.

In some embodiments, the channel region may be separated from the gate layer by the gate dielectric layer having a thickness of less than about 3 nanometers.

In some embodiments, the gate layer may include respective crystalline semiconductor gate layers on opposing surfaces of the channel region, and the gate dielectric layer may include respective gate dielectric layers between the respective gate layers and the opposing surfaces of the channel region.

In some embodiments, the respective gate layers on the opposing surfaces of the channel region may be primary gate layers. A secondary gate layer may be provided on at least one sidewall of the channel region between the opposing surfaces thereof. The secondary gate layer may be formed of a metal material or a doped polycrystalline material.

In some embodiments, a structure including the gate stack and the body layer may be repeatedly stacked to define a plurality of individually-gated channel regions.

In some embodiments, the plurality of individually-gated channel regions may define a fin protruding from a substrate, and the secondary gate layer may extend on opposing sidewalls of the fin and on a surface therebetween.

In some embodiments, an amorphous insulating layer may separate sidewalls of the channel region from the secondary gate layer.

In some embodiments, source/drain regions may be provided on opposite ends of the channel region and adjacent the gate stack thereon; and amorphous insulating layers may separate opposing sidewalls of the gate layer from the source/drain regions.

In some embodiments, an interface between the channel region and the gate stack may be free of low-k crystalline buffer layers.

In some embodiments, an interface between the channel region and the gate stack may be free of amorphous materials.

In some embodiments, the channel region, the gate dielectric layer, and/or the gate layer may be III-V or II-VI materials.

In some embodiments, the gate dielectric layer may be a wide bandgap II-VI semiconductor material, and the gate layer may be a moderate bandgap III-V semiconductor material.

In some embodiments, the channel region may be indium arsenide (InAs), the gate dielectric layer may be zinc telluride (ZnTe), and the gate layer may be aluminum antimonide (AlSb).

In some embodiments, the gate layer may be gallium antimonide (GaSb), the gate dielectric layer may be zinc telluride (ZnTe), and the channel region may be indium antimonide (InSb).

According to further embodiments of the inventive concepts, a method of fabricating a field effect transistor includes forming a body layer including a crystalline semiconductor channel region therein, and forming a gate stack on the channel region. The gate stack includes a crystalline semiconductor gate layer and a crystalline semiconductor gate dielectric layer between the gate layer and the channel region.

In some embodiments, the gate dielectric layer may be a high-k crystalline semiconductor layer formed directly on the channel region.

In some embodiments, the channel region, the gate dielectric layer, and/or the gate layer may be formed by heteroepitaxial growth.

In some embodiments, respective crystal structures of the gate layer, the gate dielectric layer, and/or the channel region may be lattice-matched.

In some embodiments, the gate dielectric layer may be formed to a thickness of less than about 3 nanometers.

In some embodiments, in forming the gate stack, respective gate dielectric layers and respective gate layers thereon may be formed on opposing surfaces of the channel region.

In some embodiments, the respective gate layers on the opposing surfaces of the channel region may be primary gate layers, and a secondary gate layer may be formed on at least one sidewall of the channel region between the opposing surfaces thereof. The secondary gate layer may be formed of a metal material or doped polycrystalline material.

In some embodiments, forming the gate stack and the body layer may include forming a structure comprising the gate stack and the body layer repeatedly stacked to define a plurality of individually-gated channel regions prior to forming the secondary gate layer.

In some embodiments, the plurality of individually-gated channel regions may define a fin protruding from a substrate, and the secondary gate layer is formed on opposing sidewalls of the fin and on a surface therebetween.

In some embodiments, opposing sidewalls of the primary gate layers may be selectively recessed to define respective recessed regions therein, and amorphous insulating layers may be formed in the respective recessed regions. Source/drain regions may be epitaxially grown from opposite ends of the channel region, and the amorphous insulating layers may separate the opposing sidewalls of the primary gate layers from the source/drain regions.

In some embodiments, prior to forming the secondary gate layer, the sidewalls of the channel region may be selectively recessed to define recesses therein, and amorphous insulating layers may be formed in the recesses in the sidewalls of the channel region. The amorphous insulating layers may separate the channel region from the secondary gate layer.

According to still further embodiments of the inventive concepts, a field effect transistor includes a nanosheet stack having a plurality of individually gated conduction channels. The individually gated conduction channels respectively include a crystalline semiconductor channel region, a crystalline semiconductor gate dielectric layer on the channel region, and a crystalline semiconductor gate layer on the gate dielectric layer opposite the channel region.

In some embodiments, the channel region, the gate dielectric layer, and the gate layer may be lattice-matched heteroepitaxial layers.

In some embodiments, the gate layer of the individually gated conduction channels comprises a primary gate layer. A secondary gate layer may be provided on opposing sidewalls of the individually gated conduction channels. The secondary gate layer may be formed of a metal or doped polycrystalline material. The secondary gate layer is conductively coupled to all of the primary gate layers.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Aspects of the present disclosure are illustrated by way of example and are not limited by the accompanying Figures with like references indicating like elements.

DETAILED DESCRIPTION

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions are not shown to scale, and in some instances may be exaggerated for clarity.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "on" or "connected" to another element, it can be directly on or connected to the other element, or intervening elements may be present. In contrast, when an element is referred to as being "directly on" or "directly connected" to another element, there are no intervening elements present. In no event, however, should "on" or "directly on" be construed as requiring a layer to completely cover an underlying layer.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the Figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the inventive concepts arise from a realization that the use of crystalline buffer materials on and/or around the channel region may suppress SR scattering at the expense of short channel performance, introducing a tradeoff between mobility and short-channel performance in III-V MOSFETs. Some embodiments of the inventive concepts provide a III-V FET structure which reduces and/or eliminates this tradeoff to improve the potential of III-V FETs.

In particular, some embodiments of the inventive concepts introduce a III-V channel FET in which the channel layer and gate stack are formed substantially or entirely of monocrystalline, lattice matched semiconductors. For example, the gate stack may include a II-VI wide bandgap, high-k (i.e., having a high dielectric constant relative to silicon dioxide) semiconductor as the gate dielectric layer, and a moderate bandgap III-V semiconductor as the gate layer. In some embodiments, the channel material is indium arsenide (InAs), the gate dielectric material is zinc telluride (ZnTe), and the gate material is aluminum antimonide (AlSb). Multiple channel layers (and multiple gate stacks) may be formed, for example, as determined by or otherwise based on a targeted current-carrying capacity requirement of the device. Each channel layer may be gated from above and below by heavily doped AlSb layers. A ZnTe gate dielectric layer may be provided between each channel layer and the adjacent gate layers. The channel/dielectric/gate stacks may be arranged in thin layers (having respective widths greater than respective thicknesses thereof), hereafter referred to as nanosheets. The overall structure may provide a FET with high channel mobility (e.g., due to reduction or minimization of surface roughness (SR) scattering), good short-channel behavior (e.g., due to the absence of conductive buffer layers further separating the channel from non-crystalline layers, thus keeping inversion layers close to the gates), and low parasitic resistance (e.g., due to high conductivity of doped InAs and low contact resistance for n-contacts), suitable for use in 7 nm technologies and beyond.

Figure 1A:
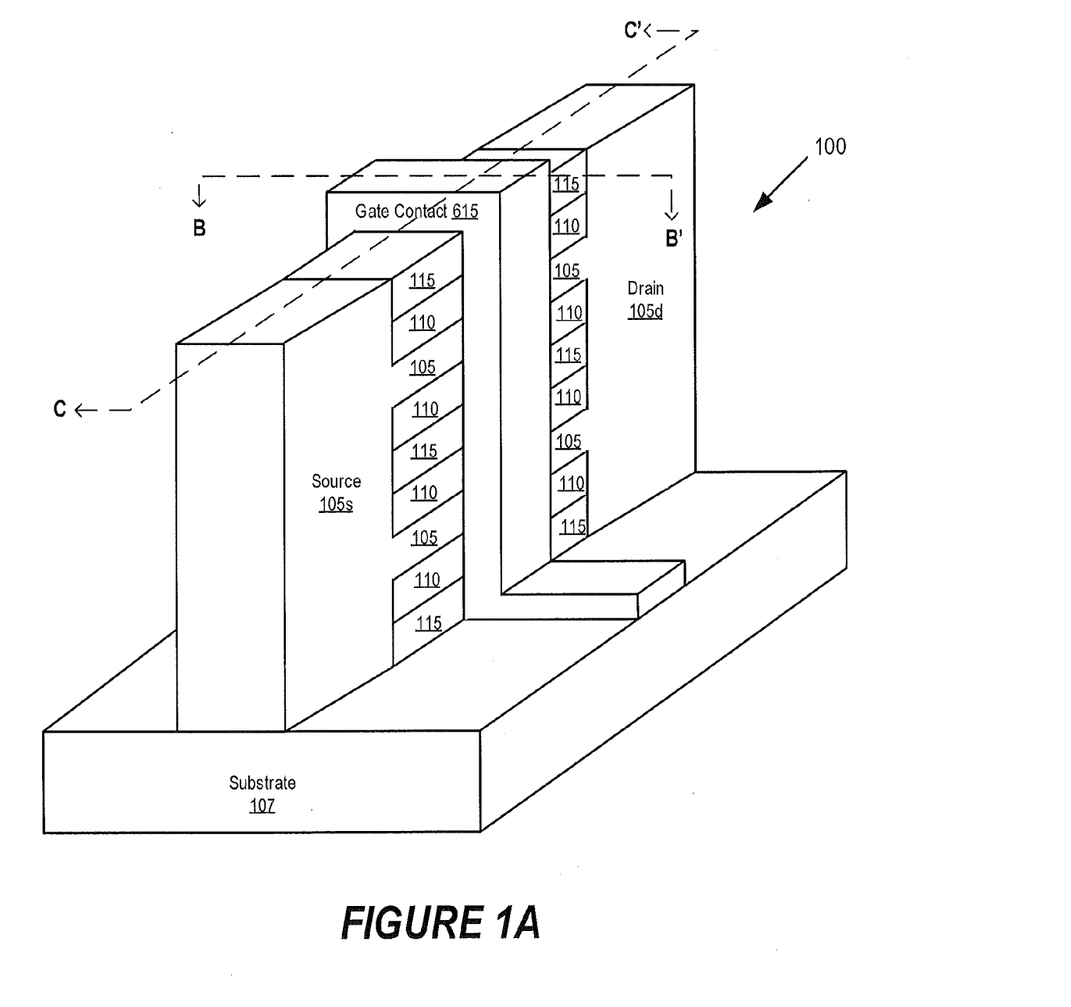
FIG. 1A is a perspective view illustrating FETs having crystalline channel, dielectric, and gate layers in accordance with some embodiments of the present inventive concepts.
Figure 1B:
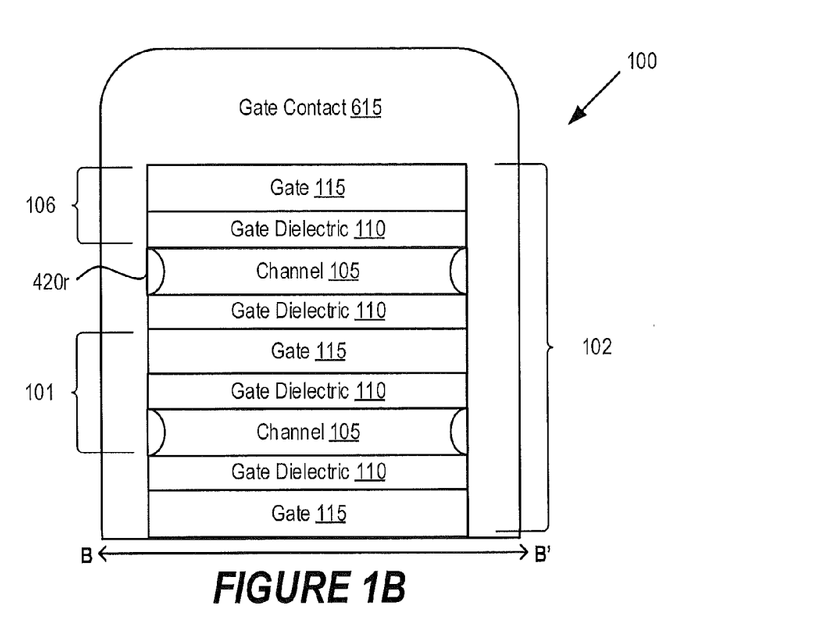
FIGS. 1B and 1C are cross sectional views taken along lines B-B' and C-C' of FIG. 1A, respectively.
Figure 1C:
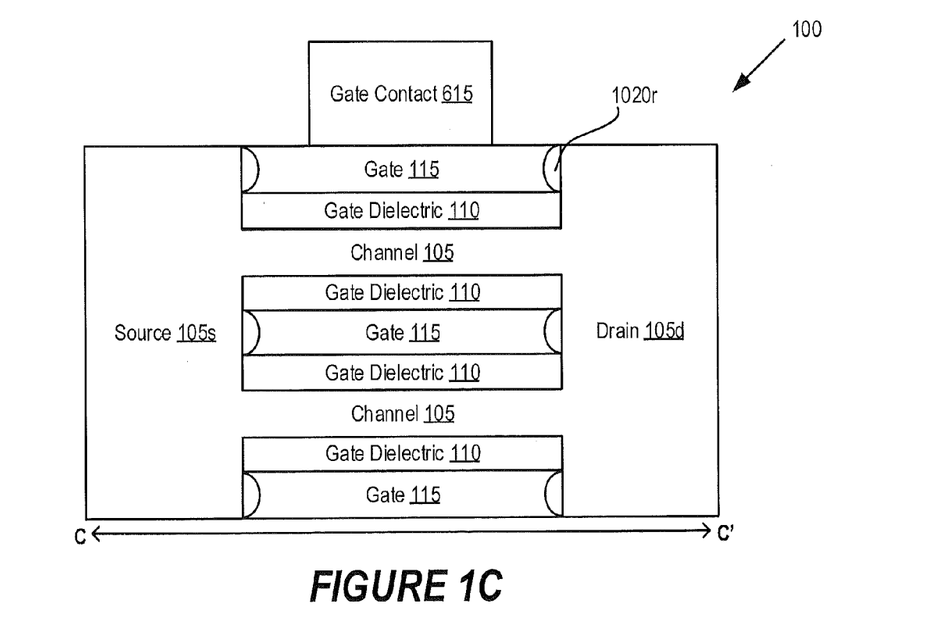

FIG. 1A is a perspective view illustrating FET devices including a crystalline channel, gate, and dielectric layers in accordance with some embodiments of the present inventive concepts, while FIGS. 1B and 1C are cross sectional views taken along lines B-B' and C-C' of FIG. 1A, respectively. As shown in FIGS. 1A-1C, a field effect transistor (FET) 100 in accordance with some embodiments of the present inventive concepts includes a structure 102 having a semiconductor active or body layer defining a transistor channel layer or region 105, and a semiconductor gate stack 106 on the channel region 105. The gate stack 106 includes a crystalline gate dielectric layer 110 and a crystalline gate layer 115 (also referred to herein as a primary gate layer or first gate electrode) thereon. The crystalline gate dielectric layer 110 may be a high-k, wide bandgap semiconductor, while the crystalline gate layer 115 may be a moderate bandgap semiconductor with high dopant activation. For example, the structure may include an indium arsenide (InAs) channel region 105, a zinc telluride (ZnTe) gate dielectric layer 110, and a highly-doped aluminum antimonide (AlSb) gate layer 115, all of which may be monocrystalline in some embodiments.

The channel region 105 is a crystalline semiconductor layer extending between source and drain regions 105s and 105d on opposite sides thereof. The source/drain regions 105s/105d may be highly doped, resulting in low contact resistance. The source/drain regions 105s/105d may also be formed of crystalline semiconductor materials, and may be formed of the same material as the channel region 105 in some embodiments. The source/drain regions 105s/105d may also be partly formed of a metal for lower resistance in some embodiments.

A structure including the channel layer 105, gate dielectric layer 110, and gate layer 115 defines an individually gated channel region, also referred to herein as a nanosheet 101, which is repeated to define a plurality of stacked, individually gated channel regions, also referred to herein as a nanosheet stack 102. The nanosheet stack 102 is thus a three-dimensional structure that may be formed on (e.g., as a protruding fin on a surface of) or within (e.g., in a trench defined in) a substrate 107, and may include any number/ amount of individually-gated channels 105, for example, based on a desired application. For instance, the number or quantity of channels 105 in the transistor 100 may be determined by a targeted current carrying capacity for the transistor 100. Each of the channel layers 105 may be relatively thin (i.e., less than about 10 nanometers in thickness), allowing for improved electrostatic control. The substrate 107 may, for example, be a silicon substrate, a silicon-on-insulator (SOI) substrate, or other substrate.

The use of crystalline semiconductor materials for the gate dielectric layer 110, the gate layer 115, and the channel region 105 allows for an almost entirely crystalline nanosheet stack 102, with the crystalline gate dielectric layer 110 being directly on the crystalline channel region 105. The interface between the channel region 105 and the gate stack 106 may thus be free of amorphous or non-crystalline layers, thereby reducing SR scattering due to the lack of interface surface roughness. The transistor 100 may thereby exhibit very high channel mobility. The interface between the channel region 105 and the gate stack 106 may also be free of low-k crystalline buffer layers, such as indium phosphide (InP), which may improve short channel performance of the transistor 100 by improving (i.e., reducing) the equivalent oxide thickness (EOT), as only the relatively thin gate dielectric layer 110 (e.g., about 2-3 nm in thickness) separates the gate layer 115 from the channel region 105.

Also, as shown in the embodiments of FIGS. 1A-1C, each of the channel regions 105 includes a gate stack 106 thereabove and therebelow (that is, on opposing surfaces of the channel region 105), allowing for improved control. For example, the two-dimensional electron gas (2DEG) in each indium arsenide channel region 105 may be gated from above (i.e., on top of the channel 105) and below (i.e., at the bottom of the channel 105). In addition, each of the layers 105, 110, 115 of the nanosheet stack 102 may have respective crystal structures that are substantially lattice matched with the layer therebelow. For example, the layers 105, 110, and/or 115 may be lattice matched heteroepitaxial layers.

The transistor 100 also includes a metal or polycrystalline gate contact layer (also referred to herein as a secondary gate layer or second gate electrode) 615 on an upper surface and opposing sidewalls (that is, on at least three sides) of nanosheet stack 102. The gate contact layer 615 electrically contacts each of the gate layers 115 in the nanosheet stack 102 such that multiple gates 115 may be controlled by a single gate electrode/contact 615, defining a multi-gate, multi-channel device.

Physical properties of a nanosheet stack 102 according to some embodiments of the inventive concepts may include, but are not limited to: a fully crystalline, lattice matched, multi-channel structure including crystalline semiconductor channels 105, gate dielectric layers 110, and gate layers 115; each channel 105 is gated at top and bottom, where the gates 115 are electrically contacted by a common gate contact 615; a ZnTe gate dielectric layer 110 having bandgap of about 3 eV (wide-bandgap semiconductor) with a k of 7.9 (moderate high-k); an AlSb gate layer 115 having a bandgap of about 1.5 eV (moderate bandgap semiconductor) with high dopant activation; and/or multiple channel layers 105, as many as desired for a particular application.

Electrical properties of a nanosheet stack 102 according to some embodiments of the inventive concepts may include, but are not limited to: improved (i.e., thinner) EOT, due to the absence or omission of InP or other buffer layers between the channel region 105 and the gate layer 115; the 2DEG in each InAs channel layer 105 can be controlled from above and below by respective gate layers 115; reduced SR scattering due to the absence/omission of surface roughness/ amorphous layers at the interface between the channel layer 105 and the gate dielectric layer 110, (with only small amounts of amorphous insulating layers 420r present at sidewalls of the channel layer 105 for insulation from the gate contact 615); low parasitic resistance and/or low contact resistance due to the highly doped InAs source/drain regions 105s/105d; and high channel mobility, without the use of buffer layers (due to the absence of amorphous layers at the interface between the channel layer 105 and the gate dielectric layer 110). As such, embodiments of the present inventive concept may reduce and/or eliminate the mobility/ EOT tradeoff.

Although illustrated with reference to an example structure in FIGS. 1A-1C, it will be understood that embodiments of the present inventive concepts are not so limited. For example, in some embodiments, the nanosheet stack 102 may define a three-dimensional fin-shaped active region protruding from a substrate, with the gate contact layer 615 on an upper surface and sidewalls thereof, in a finFET structure. In other embodiments, the nanosheet stack 102 may be similarly formed within a trench structure in a substrate, with the gate contact 615 extending along at least sidewalls of the trench between the substrate and the nanosheet stack 102. The gate contact 615 may also extend on a top surface of the nanosheet stack in a gate-all-around (GAA) FET structure. More generally, while described herein with reference to particular structures, embodiments of the present inventive concepts may include any structure implementing the substantially crystalline channel/dielectric/gate stack or sub-structures thereof described herein.

Figure 2:
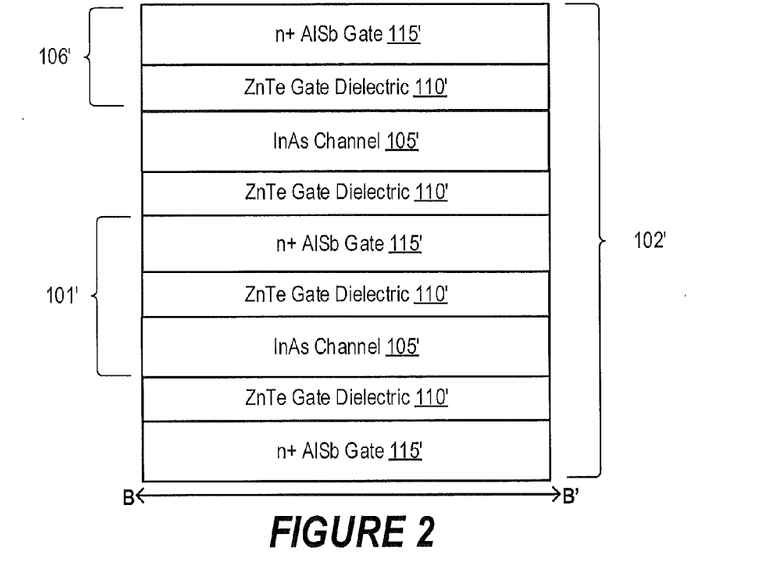
FIGS. 2-6 are cross sectional views taken along line B-B' of FIG. 1A, illustrating methods of fabricating FETs having crystalline channel, dielectric, and gate layers in accordance with some embodiments of the present inventive concepts.

FIGS. 2-12 are cross sectional views illustrating methods of fabricating FET devices in accordance with some embodiments of the present inventive concepts, where FIGS. 2-6 are cross sectional views taken along line B-B' of FIG. 1. Referring now to FIG. 2, in forming a multi-channel III-V FET according to some embodiments of the inventive concepts, a substantially or fully crystalline nanosheet stack 102' is formed. Each nanosheet 101' in the stack 102' includes a gate layer 115' and a gate dielectric layer 110' (which define a gate stack 106'), and a channel layer 105'. One or more of the layers 105', 110', 115' in the stack 102' may be epitaxially grown crystalline semiconductor layers (including, for example, II-VI and/or III-V materials), such that the respective crystallographic orientations of the layers 105', 110', and/or 115' are ordered or registered with the layer therebelow. In the embodiments of FIGS. 2-12, each of the channel layers 105' includes a gate layer 115' on opposite sides thereof and separated therefrom by a respective dielectric layer 110', such that the channel layers 105' are individually-gated from above and below.

Some or all of the layers 105', 110', 115' are formed using semiconductor materials having substantially lattice-matched crystal structures. In the example fabrication methods shown in FIGS. 2-12, the gate layer 115' is formed using heavily doped (n+) AlSb, the dielectric layer 110' is formed using intrinsic ZnTe (or other wide-bandgap II-VI semiconductor), and the channel layer 105' is formed using intrinsic (or lightly doped) InAs. The channel layers 105' may be relatively thin (e.g., from about 2 nm to about 10 nm in thickness) for good electrostatic control, thereby forming multiple quantum wells. Multiple nanosheets 101' may be formed (for example, by alternating heteroepitaxial growth of the layers 105', 110', 115') to define a stack including as many channel regions 105' as may be desired, for example, to meet current and/or layout area constraints.

The use of a substantially or fully crystalline nanosheet stack 102' in accordance with embodiments of the inventive concepts may largely reduce SR scattering, even without the use of buffer layers. In addition, the absence or omission of buffer layers may improve short-channel performance, providing devices suitable for sub-10 nm integration. FET devices according to embodiments of the inventive concepts may thus have high mobility, good short-channel behavior, and excellent parasitic resistance, in addition to the low density of states in the channel(s) and correspondingly low capacitance found in other III-V devices.

Thus, devices according to embodiments of the inventive concepts may excel in or otherwise provide improved CV/I metrics. The low charge sheet density of the inversion layer in the channel regions 105' may also allow the use of a heavily doped polycrystalline gate contact (rather than a metal gate contact) to surround the fully crystalline stack 102' on multiple sides thereof, which may simplify manufacturing processes (as discussed below with reference to FIG. 6), since the associated low charge density in the heavily doped gate contact may result in a very thin depletion layer (and consequently may not significantly degrade electrostatic performance).

Figure 3:
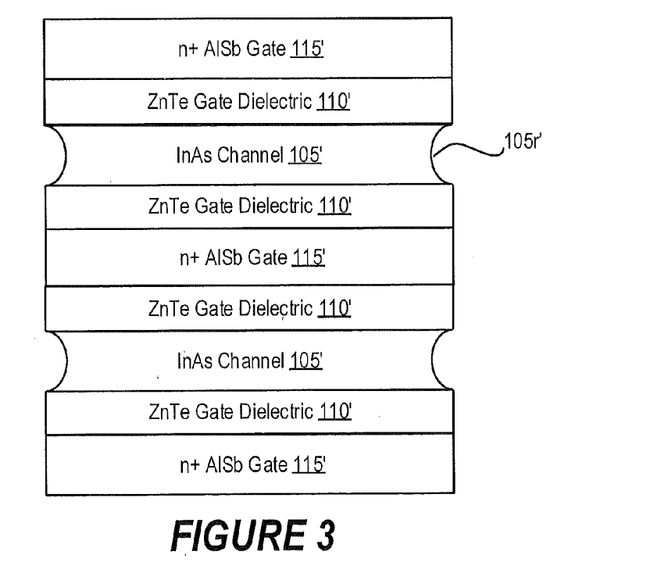

In order to form contacts to the three-dimensional nanosheet stack 102', the channel regions 105' should be insulated from contact with any gates or metal layers. As such, as shown in FIG. 3, a selective isotropic etch of the channel regions 105' is performed. The etchant is selected to remove portions of the channel region 105' at sidewalls of the nanosheet stack 102', without substantially removing or otherwise damaging the gate layers 115' and/or gate dielectric layers 110'. For example, for selectively etching the InAs channel region 105' of FIG. 3, acetic acid and hydrogen peroxide may be used as etchants. However, other etch chemistries may be used to selectively etch the channel layers 105' without substantially etching the gate layers 115' and/or gate dielectric layers 110', depending on the particular materials thereof. As such, sidewalls of the channel regions 105' are selectively recessed relative to the sidewalls of the nanosheet stack 102', defining recessed regions 105r'.

Figure 4:
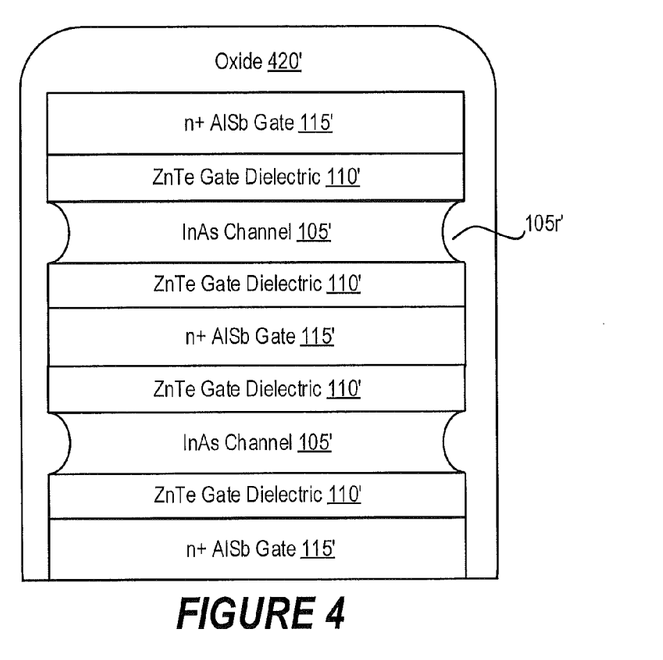

Referring now to FIG. 4, an insulating layer 420' is deposited or otherwise formed on the sidewalls and upper surface of the nanosheet stack. The insulating layer 420' may be an oxide or other amorphous layer, and may be formed on the stack 102' to substantially fill the recessed regions 105r' at the sidewalls of the channel layers 105'.

Figure 5:
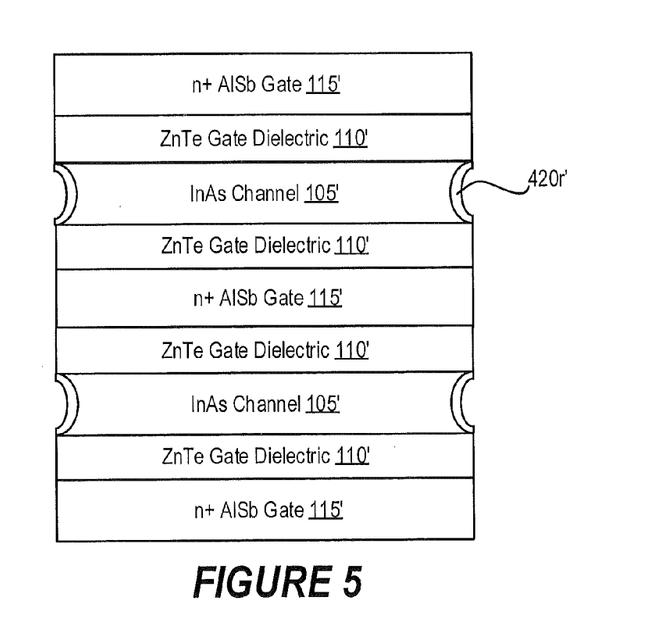

As shown in FIG. 5, an etching process is performed to remove the insulating layer 420' from the upper surface and sidewalls of the nanosheet stack 102'. For example, where an oxide layer is used as the insulating layer 420', a plasma etching process may be used to remove the oxide layer. However, portions of the insulating layer 420' may remain in the recessed regions 105r' at the sidewalls of the channel layers 105'. These remaining portions 420r' of the insulating layer 420' may electrically isolate the channel layers 105' from one or more conductive layers formed in subsequent processes.

Figure 6:
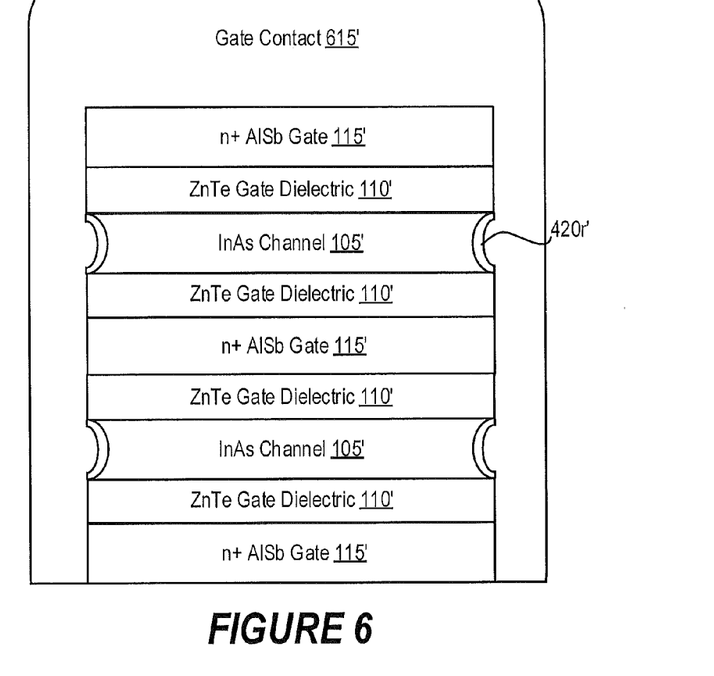

Referring now to FIG. 6, a gate contact layer 615' is selectively formed on portions of the upper surface and sidewalls of the nanosheet stack 102'. The gate contact layer may also be referred to herein as a secondary or top gate 615'. The gate contact layer 615' may thereby "wrap" the entire nanosheet stack 102', providing electrical contact to each of the gate layers 115' of the stack 102', allowing for collective control thereof. However, the channel layers 105' may be electrically isolated from the gate contact 615' by the remaining portions 420r' of the insulating layer 420' at the sidewalls thereof. In particular, as shown in FIG. 6, the gate contact layer 615' may contact the AlSb gate layers 115' at sidewalls thereof, but may be separated and electrically isolated from the InAs channels 105' by the remaining insulating layer portions 420r'.

The gate contact layer 615' may include metal or semiconductor materials. For example, a polycrystalline semiconductor material may be used as the gate contact 615' in some embodiments. The polycrystalline gate contact 615' may be heavily doped, and the relatively low charge density in the heavily doped gate contact 615' may result in a relatively thin depletion layer (and consequently, may not significantly degrade electrostatic performance of the device). The absence of metal in the gate contact layer 615' may also simplify manufacturing processes. However, in other embodiments, a metal material may be used as the gate contact 615' for improved control and/or performance. For example, the polycrystalline gate contact 615' may be replaced by metal at the end of or after processing operations as described herein in some embodiments.

FIGS. 7-12 are cross sectional views further illustrating methods of fabricating FET devices in accordance with some embodiments of the present inventive concepts, taken along line C-C' of FIG. 1A. In embodiments where the gate contact layer 615' of FIG. 6 includes polycrystalline semiconductor material(s), the operations of FIGS. 7-12 may be performed after formation of the gate contact layer 615' in FIG. 6.

Figure 7:
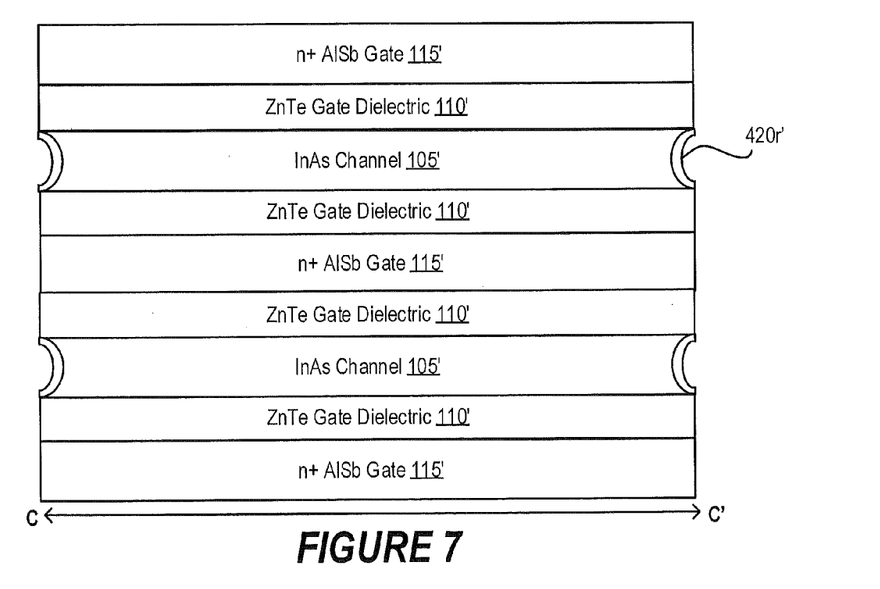
FIGS. 7-12 are cross sectional views taken along line C-C' of FIG. 1A, illustrating methods of fabricating FETs having crystalline channel, dielectric, and gate layers in accordance with some embodiments of the present inventive concepts.
Figure 8:
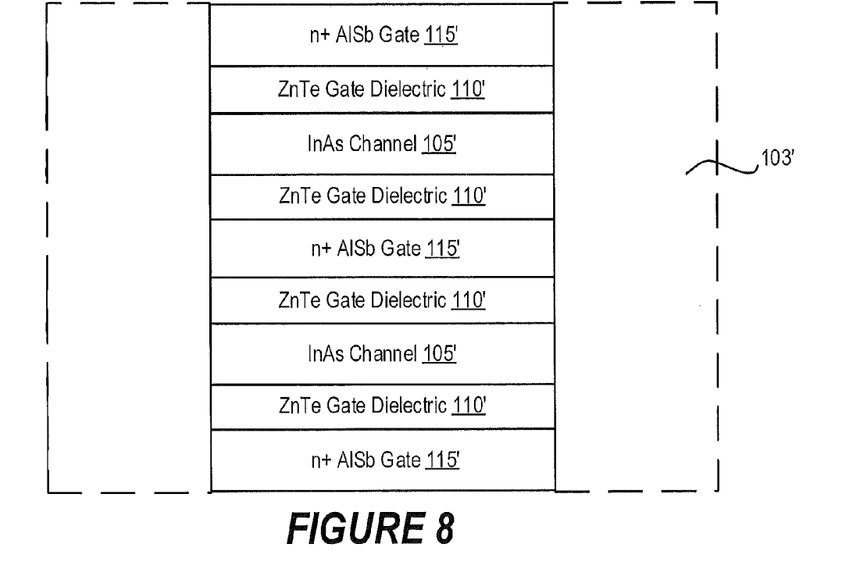

As shown in the cross-section of FIG. 7, sidewalls of the channel layers 105' remain electrically insulated by the remaining insulating layer portions 420r' in the recessed regions 105r' thereof. As such, to allow for contact between the channel layers 105' and the source/drain regions, an etching process is performed to remove portions of the nanosheet stack 102' at which the source/drain regions will be formed in subsequent operations. In particular, as shown in FIG. 8, the nanosheet stack 102' is patterned (for example, using a mask) and etched to remove portions thereof 103' at opposite sides of the channel layers 105'.

Figure 9:
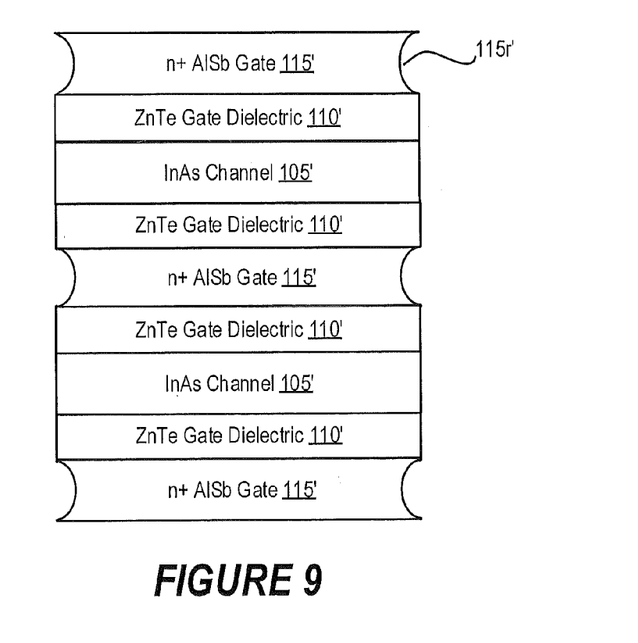

Referring now to FIG. 9, a selective etch of the gate layers 115' is performed. The etchant is selected to selectively remove portions of the gate layers 115' without substantially removing or otherwise damaging the gate dielectric layers 110' and/or the channel layers 105'. For example, for the AlSb gate layers 115' shown in FIG. 9, hydrogen fluoride, hydrogen peroxide and lactic acid, and/or AZ400K may be used as etchants. However, other etch chemistries may be used to selectively etch the gate layers 115' without substantially etching the gate dielectric 110' and or channel layers 105', depending on the particular materials thereof. As such, sidewalls of the gate layers 115' are selectively recessed relative to the sidewalls of the nanosheet stack 102' to define recessed regions 115r'.

Figure 10:
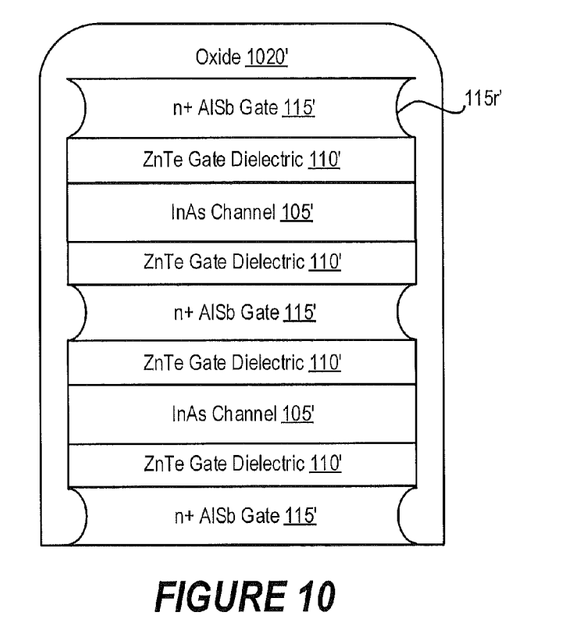

As shown in FIG. 10, an insulating layer 1020' is deposited or otherwise formed on the sidewalls and upper surface of the nanosheet stack 102'. The insulating layer 1020' may be an oxide or other amorphous layer, and may be formed on and/or substantially fill the recessed regions 115r' at the sidewalls of the gate layers 115'.

Figure 11:
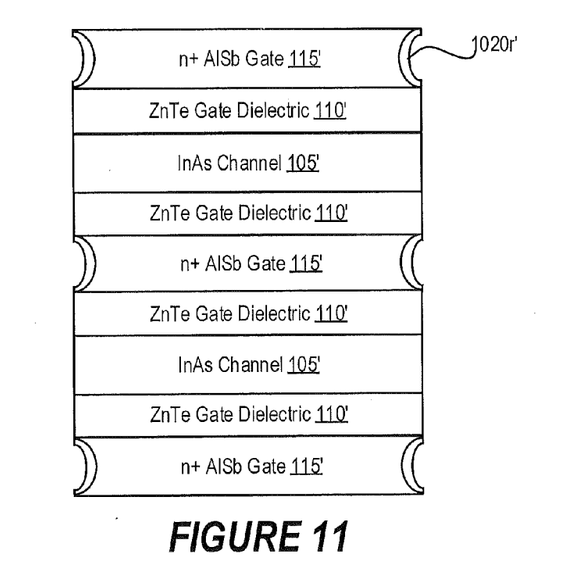

Referring now to FIG. 11, an etching process is performed to remove the insulating layer 1020' from the upper surface and sidewalls of the nanosheet stack 102'. For example, where an oxide layer is used as the insulating layer 1020', a plasma etching process may be used to remove the oxide layer. However, portions 1020r' of the insulating layer 1020' may remain in the recessed regions 115r' at the sidewalls of the gate layers 115'. These remaining portions 1020r' of the insulating layer may electrically isolate the gate layers 115' from the source/drain regions formed in subsequent processes.

Figure 12:
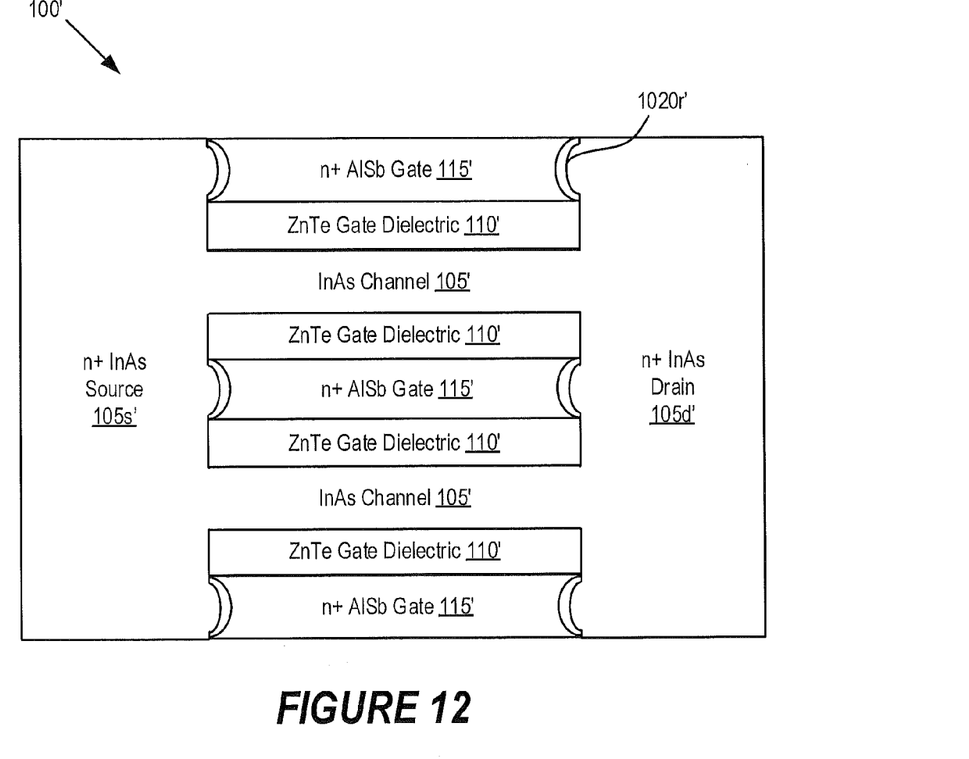

In particular, as shown in FIG. 12, InAs source/drain regions 105s'/105d' are formed at opposite sides of the InAs channel layers 105' in the nanosheet stack 102' to complete the FET 100'. The source/drain regions 105s'/105d' may be formed by an epitaxial regrowth process. In particular, in the example of FIG. 12, in-situ doped n+ InAs regions are epitaxially grown on opposite sides of the channel layers 105' (that is, at the regions 103' of the nanosheet stack that were patterned and etched in FIG. 8). As such, the source/drain regions 105s'/105d' may contact the channel layers 105' at sidewalls thereof. However, the remaining insulating layer portions 1020r' in the recessed regions 115r' at the sidewalls of the gate layers 115' electrically isolate the source/drain regions 105s'/105d' from the gate layers 115'. In particular, FIG. 12 illustrates that the InAs source and drain regions 105s' and 105d' may contact the InAs channels 105', but may be separated and electrically isolated from the AlSb gates 115' by the remaining insulating layer portions 1020r'.

While embodiments of the present inventive concepts have been described herein with reference to specific materials for the channel layers, gate dielectric layers, and gate layers, it will be understood that other materials may also be used. In particular, the InAs channel layer 105'/ZnTe dielectric layer 110'/AlSb gate layer 115' nanosheet stack 102' described herein may be selected to provide a reduced or minimal lattice mismatch between the layers 105', 110', and 115'. However, in some embodiments, a small amount of mismatch (e.g., on the order of 1%) may be used, resulting in strain in the layers 105', 110', and/or 115', provided that the layers are thin enough (or the strain is small enough) to reduce or prevent relaxation (and the consequent introduction of defects). For example, gallium antimonide (GaSb) can be used for the gate layer 115, with indium antimonide (InSb) for the channel layer 105, which may result in even higher or increased mobility. Also, InAs may be used to create ohmic contacts at the source and drain regions 105s and 105d, which may result in lower or reduced parasitic resistance.

Embodiments of the present inventive concepts may provide several advantages. In particular, devices described herein may offer a high-mobility channel, since SR scattering is largely reduced and/or eliminated by the absence of amorphous layers at the interface between the channel layer 105 and the gate stack 106. Also, short-channel performance may be compatible with sub-10 nm scaling, due to an absence of buffer layers that increase the effective gate oxide thickness.

In addition, the top gate 615 surrounding (or "wrapping") the stack 102 of nanosheets 101 can be metal or polycrystalline semiconductor. A polycrystalline top gate 615 may be used in some embodiments with little electrostatic penalty given the expected low charge sheet densities, and the absence of metal in the top gate 615 may simplify fabrication processes. In other embodiments, however, metal may be used as the top gate 615 to provide improved control and/or performance.

Some embodiments of the inventive concepts may thus provide a high-performance multi-channel III-V FinFET, where each channel is individually gated. No crystalline buffer layers may be used, allowing for high mobility and good (i.e., thinner) EOT. FinFET devices as described herein may also be fabricated using some existing processing operations. Features of specific example embodiments of the present inventive concepts are noted below:

(1) A FET, including a substantially or fully crystalline stack of multiple lattice-matched layers, the multiple lattice-matched layers forming individually-gated conduction channels.

(2) A FET, as in (1), with a subset of the multiple lattice-matched layers forming crystalline conduction channels, a subset of the multiple lattice-matched layers forming crystalline gate dielectrics, and a subset of the multiple lattice-matched layers forming crystalline first gate electrodes, each crystalline conduction channel in the substantially or fully crystalline stack partially or completely surrounded by a crystalline gate dielectric and a crystalline first gate electrode.

(3) A FET, as in (1), in which the lattice-matched layers include III-V or II-VI materials.

(4) A FET, as in (2), with the conduction channels formed of InAs, the gate dielectrics formed of ZnTe, and the first gate electrodes comprised of AlSb.

(5) A FET as in (4), further comprising a finFET, the finFET formed with a second gate electrode wrapping around the substantially or fully crystalline stack of multiple lattice-matched layers, the second gate electrode selectively contacting the first gate electrodes, the second gate electrode and first gate electrodes forming gate-all-around structures, the gate-all-around structures surrounding the individually-gated conduction channels.

(6) A FET as in (5), the second gate electrode including a metal or polycrystalline semiconductor.

(7) A FET as in (6), the finFET formed with a source/drain electrode, the source/drain electrode only selectively contacting the conduction channels.

(8) A FET as in (7), the source/drain electrode including InAs.

(9) A finFET as in (8), including a high mobility conduction channel, the high mobility due to reduction or substantial elimination of surface-roughness scattering in the regions above and below each conduction channel.

(10) A method of forming a finFET as in (8), the method including forming a substantially or fully crystalline stack of multiple lattice-matched layers, forming a second gate electrode wrapping around the crystalline stack of multiple lattice-matched layers, the second gate electrode selectively contacting the first gate electrodes, and forming a source/drain electrode selectively contacting the conduction channels.

Accordingly, field effect transistors in accordance with some embodiments of the inventive concepts can simultaneously achieve the formerly competing goals of high channel mobility (e.g., due to the substantial absence of amorphous or noncrystalline layers on the channel region) and improved short channel performance (e.g., due to the absence of crystalline buffer layers between the channel region and the gate stack, which may increase the effective the gate oxide thickness). Thus, embodiments of the inventive concepts may reduce and/or eliminate the mobility-EOT trade-off.

While the inventive concepts have been shown and described herein with reference to example embodiments thereof, it will be understood that various changes in form and details may be made therein without departing from the spirit and scope of the following claims.

That which is claimed:

1. A field effect transistor, comprising:
 a body layer comprising a crystalline semiconductor channel region therein; and
 a gate stack on the channel region, the gate stack comprising a crystalline semiconductor gate layer and a crystalline semiconductor gate dielectric layer between the crystalline semiconductor gate layer and the crystalline semiconductor channel region,
wherein respective crystal structures of the crystalline semiconductor gate dielectric layer and the crystalline semiconductor channel region are lattice-matched, and wherein the crystalline semiconductor gate dielectric layer is not configured to supply free charge carriers to the crystalline semiconductor channel region.

2. The transistor of claim 1, wherein the gate dielectric layer comprises a high-k crystalline semiconductor layer directly on the channel region.

3. The transistor of claim 2, wherein the channel region, the gate dielectric layer, and the gate layer comprise respective heteroepitaxial semiconductor layers.

4. The transistor of claim 2, wherein the channel region has a thickness of less than about 10 nanometers, and wherein the channel region is separated from the gate layer by less than about 3 nanometers.

5. The transistor of claim 4, wherein the gate layer comprises respective crystalline semiconductor gate layers on opposing surfaces of the channel region, and wherein the gate dielectric layer comprises respective gate dielectric layers between the respective gate layers and the opposing surfaces of the channel region.

6. The transistor of claim 5, wherein the respective gate layers on the opposing surfaces of the channel region comprise primary gate layers, and further comprising:
a secondary gate layer on sidewalls of the channel region between the opposing surfaces thereof,
wherein the secondary gate layer comprises a metal or doped polycrystalline material.

7. The transistor of claim 6, wherein a structure comprising the gate stack and the body layer is repeatedly stacked to define a plurality of individually-gated channel regions.

8. The transistor of claim 7, wherein the plurality of individually-gated channel regions define a fin protruding from a substrate, and wherein the secondary gate layer extends on opposing sidewalls of the fin and on a surface therebetween.

9. The transistor of claim 6, further comprising:
amorphous insulating layers separating the sidewalls of the channel region from the secondary gate layer.

10. The transistor of claim 1, further comprising:
source/drain regions on opposite ends of the channel region and adjacent the gate stack thereon; and
amorphous insulating layers in recessed regions of opposing sidewalls of the gate layer and separating the opposing sidewalls of the gate layer from the source/drain regions.

11. The transistor of claim 1, wherein an interface between the channel region and the gate stack is free of low-k crystalline buffer layers.

12. The transistor of claim 1, wherein an interface between the channel region and the gate stack is free of amorphous materials.

13. The transistor of claim 1, wherein the channel region, the gate dielectric layer, and/or the gate layer comprise III-V or II-VI semiconductor materials.

14. The transistor of claim 13, wherein the gate dielectric layer comprises a wide bandgap II-VI semiconductor material, and wherein the gate layer comprises a moderate bandgap III-V semiconductor material.

15. The transistor of claim 13, wherein the channel region comprises indium arsenide (InAs), the gate dielectric layer comprises zinc telluride (ZnTe), and the gate layer comprises aluminum antimonide (AlSb).

16. The transistor of claim 13, wherein the gate layer comprises gallium antimonide (GaSb), the gate dielectric layer comprises zinc telluride (ZnTe), and the channel region comprises indium antimonide (InSb).

17. A field effect transistor, comprising:
a nanosheet stack comprising a plurality of individually gated conduction channels, the individually gated conduction channels respectively comprising a crystalline semiconductor channel region, a crystalline semiconductor gate dielectric layer on the crystalline semiconductor channel region, and a crystalline semiconductor gate layer on the crystalline semiconductor gate dielectric layer opposite the crystalline semiconductor channel region,
wherein a portion of the crystalline semiconductor gate dielectric layer that extends from a source region to a drain region on opposite sides of the crystalline semiconductor channel region is not configured to supply free charge carriers to the crystalline semiconductor channel region, and
wherein the crystalline semiconductor channel region, the crystalline semiconductor gate dielectric layer, and the crystalline semiconductor gate layer comprise lattice-matched heteroepitaxial layers.

* * * * *